United States Patent
Goetz et al.

(10) Patent No.: US 6,405,024 B1
(45) Date of Patent: Jun. 11, 2002

(54) FREQUENCY SYNTHESIZER WITH A PHASE-LOCKED LOOP FOR RECEIVING AND PROCESSING SIGNALS IN DIFFERENT FREQUENCY BANDS

(75) Inventors: Edmund Goetz, Dachau; Shen Feng, München; Markus Scholz, München; Georg Lipperer, München; Stefan Beyer, Mering, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/182,278

(22) Filed: Oct. 29, 1998

(30) Foreign Application Priority Data

Oct. 29, 1997 (DE) .......................................... 197 47 735

(51) Int. Cl.⁷ .............................. H04B 1/06; H03B 21/00
(52) U.S. Cl. ......................... 455/260; 455/76; 455/553; 455/84; 327/105; 327/156; 375/376
(58) Field of Search ........................... 455/76, 260, 87, 455/86, 84, 75, 552, 553, 183.1, 165.1, 209, 316; 375/327, 376; 327/159, 105, 106; 331/101

(56) References Cited

U.S. PATENT DOCUMENTS

| | | | | |
|---|---|---|---|---|
| 4,027,242 A | * | 5/1977 | Yamanaka | 455/76 |
| 4,081,752 A | * | 3/1978 | Sumi | 455/165.1 |
| 4,088,959 A | * | 5/1978 | Sumi | 455/183.1 |
| 4,149,125 A | * | 4/1979 | Ikeguchi et al. | 455/87 |
| 4,153,884 A | * | 5/1979 | Ikeguchi et al. | 455/76 |
| 4,236,251 A | * | 11/1980 | Ohgishi et al. | 455/183.1 |
| 4,441,098 A | * | 4/1984 | Borras et al. | 455/76 |
| 4,472,685 A | * | 9/1984 | Dutasta | 455/260 |
| 4,472,820 A | * | 9/1984 | Borras | 455/76 |
| 4,785,260 A | * | 11/1988 | Paneth | 331/2 |
| 4,862,107 A | * | 8/1989 | Paneth | 331/2 |
| 5,144,254 A | * | 9/1992 | Wilke | 327/156 |

(List continued on next page.)

FOREIGN PATENT DOCUMENTS

| | | | | |
|---|---|---|---|---|
| DE | 36 40 555 | | 5/1997 | H03L/7/06 |
| EP | 0 800 283 | * | 10/1997 | H04B/1/40 |
| GB | 2 279 519 | * | 1/1995 | H04B/1/40 |

OTHER PUBLICATIONS

Wilfried Blaesner, "Frequenzsynthesizer für Mobilfunk" Elektronik Oct. 1998, Frequency Synthesizers for Mobile Radio, Electronic Oct. 1996, pp. 108–112.

*Primary Examiner*—William Trost
*Assistant Examiner*—Rafael Perez-Gutierrez
(74) *Attorney, Agent, or Firm*—Laurence A. Greenberg; Werner H. Stemer; Gregory L. Mayback

(57) ABSTRACT

A frequency synthesizer for a radio terminal with which a dual-band and/or dual-mode switchover is possible in a simple manner. The frequency synthesizer has a double phase-locked loop with a high-frequency portion and an intermediate-frequency portion, each with one divider and one counter in a feedback branch. There is at least one memory for holding a plurality of divider values for the counter in the intermediate-frequency portion. The counter in the high-frequency portion is coupled to the memory in such a way that when a new divider value is written into the counter of the high-frequency portion, an associated divider value from the memory is written into the counter of the intermediate-frequency portion. In this way, the frequency generated by the intermediate-frequency divider is adapted to the frequency generated in the high-frequency portion in such a way that the requisite operating frequencies of each active mobile radio system are set automatically. In the same way, the dual-mode switchover can be carried out by coupling a further memory with further divider values for the counter of the high-frequency portion.

7 Claims, 3 Drawing Sheets

U.S. PATENT DOCUMENTS

| | | | |
|---|---|---|---|
| 5,175,872 A | | 12/1992 | Borras .......................... 455/76 |
| 5,179,729 A | * | 1/1993 | Mishima et al. ............ 455/260 |
| 5,526,527 A | * | 6/1996 | Lipowski et al. ........ 455/183.1 |
| 5,535,432 A | * | 7/1996 | Dent .......................... 455/76 |
| 5,603,099 A | * | 2/1997 | Watanabe ................... 455/260 |
| 5,610,559 A | * | 3/1997 | Dent .......................... 455/260 |
| 5,712,595 A | * | 1/1998 | Yokoyama ................... 455/76 |
| 5,734,970 A | * | 3/1998 | Saito ........................... 455/76 |
| 5,737,694 A | * | 4/1998 | McMahill et al. ............. 455/76 |
| 5,752,175 A | * | 5/1998 | Roullet et al. ........... 455/183.1 |
| 5,890,051 A | * | 3/1999 | Schlang et al. ................ 455/76 |
| 5,896,562 A | * | 4/1999 | Heinonen .................... 455/76 |
| 5,937,338 A | * | 8/1999 | Tomita ................... 455/161.2 |
| 6,061,575 A | * | 5/2000 | Lombardi ..................... 455/76 |
| 6,094,236 A | * | 7/2000 | Abe et al. ................ 455/191.1 |
| 6,115,586 A | * | 9/2000 | Bezzam et al. ................ 455/76 |

| System | Time Slot | IF-PLL | RF-PLL | Circuit Part |
|---|---|---|---|---|
| GSM | RX | $f_{LO2}(RX)$ | $f_{LO1}(RX)1$ | Receive Part |
| GSM | TX | $f_{LO2}(TX)1$ | $f_{LO1}(TX)1$ | Transmit Part |
| GSM | MON | $f_{LO2}(RX)$ | $f_{LO1}(RX)2$ | Receive Part |
| DCS1800 | RX | $f_{LO2}(RX)$ | $f_{LO1}(RX)3$ | Receive Part |
| DCS1800 | TX | $f_{LO2}(TX)2$ | $f_{LO1}(TX)2$ | Transmit Part |
| DCS1800 | MON | $f_{LO2}(RX)$ | $f_{LO1}(RX)4$ | Receive Part |

FREQUENCY SYNTHESIZER WITH A PHASE-LOCKED LOOP FOR RECEIVING AND PROCESSING SIGNALS IN DIFFERENT FREQUENCY BANDS

BACKGROUND OF THE INVENTION

1. Field of the Invention

The invention relates to a frequency synthesizer with a double PLL array, which has a first counter and a second counter, each in a respective feedback,branch, for selectively setting the frequency. Such a double PLL array (PLL stands for phase-locked loop) is used for instance in mobile radio technology for frequency synthesis in mobile radio units. The basic layout of the essential elements of a double PLL is described, for instance in the article by Wilfried Blasner, "Frequenzsynthesizer für Mobilfunk" [Frequency Synthesizers for Mobile Radio], Elektronik [Electronics], 10/1996, pp. 108–112, especially FIG. 2. Here one PLL array acts as a high-frequency PLL, hereinafter called an RF-PLL, and the other acts as an intermediate-frequency PLL, hereinafter called an IF-PLL. The various frequencies for transmitting and receiving are set with the double PLL array, as are the channel-dependent frequencies. To that end, a first mixing stage cooperating with a first local oscillator and a second mixing stage cooperating with a second local oscillator are present in the receiver part.

For use in the various mobile radio systems, the terminal mobile radio units, also generally known as radio terminals (RT), are adapted to the specific frequency ranges of the mobile radio systems, which are called bands. That is, the frequency synthesizer of a radio terminal in one mobile radio system generates different frequencies from the frequency synthesizer of another radio terminal.

Known mobile radio systems also differ in other operating parameters as well, such as the reference frequency, channel frequency, and the like. Thus one radio terminal can be used only within a particular mobile radio system.

One widely used mobile radio system in Europe is the GSM system (for Groupe Speciale Mobile; D1/D2 network), which is operated in a frequency range of approximately 900 MHz.

Another mobile radio system in the frequency range of about 1800 MHz is in use, under the designation DCS 1800 (Digital Cellular System 1800). It is indeed known to combine the GSM infrastructure with the DCS 1800 infrastructure, which is known as dual band, so that an overall economical common network can be built up. Nevertheless, for each standard, its own radio terminals have to be used.

This is all the more true for mobile radio systems that differ in still other operating parameters as well, such as the DECT standard for cordless telephones. To the extent that systems can be used for both the DECT standard and some other standard, for example, they are called dual-mode systems.

SUMMARY OF THE INVENTION

It is accordingly an object of the invention to provide a frequency synthesizer for a radio terminal, which overcomes the above-mentioned disadvantages of the prior art devices of this general type, which can be used in mobile radio systems with different network frequencies and/or different operating parameters and being easy to use.

With the foregoing and other objects in view there is provided, in accordance with the invention, a frequency synthesizer for a radio terminal, including: a clock outputting a clock signal; a first phase-locked loop for generating a high-frequency signal, having: a first frequency divider receiving the high-frequency signal; a second frequency divider receiving the clock signal; and a memory connected to the first frequency divider and storing divider ratios; a second phase-locked loop for generating an intermediate-frequency signal, having: a first frequency divider receiving the intermediate frequency signal; a second frequency divider receiving the clock signal; and a memory connected to the first frequency divider and storing further divider ratios; and the memory of the first phase-locked loop coupled to the memory of the second phase-locked loop.

The invention has the advantage that as a function of control data that are transmitted from a base station, a switchover to the frequency range or the pertinent operating parameters of the applicable mobile radio system is done automatically, without action by the user. The user can therefore use the radio terminal as a dual-band or dual-mode radio terminal in the same way, within range of either one mobile radio system or another, without having to bother with adaptation or switchover.

It is accordingly a fundamental concept of the invention that for basic initialization, the requisite divider values for the frequency dividers of the double PLL are transmitted from the base station to the radio terminal and stored in memory there. In later operation, basically only a single control value is transmitted from the base station to the radio terminal, and by way of this value the selection of stored divider values and in addition, optionally, the modification and switchover of other operating parameters, are brought about. Any change in the divider values for the high-frequency portion of the double PLL (RF-PLL) automatically, by suitable linkage with the frequency dividers of the intermediate-frequency portion of the double PLL (IF-PLL), brings about the associated change in the divider values of the IF-PLL.

The storage of the divider values in memory is done in the simplest case in individual registers, which are selected via a multiplexer under control by the base station. In principle, however, any other kind of memory and memory triggering are suitable for arriving at the required divider values and making the required logical linkages.

In a preferred embodiment of the invention, for using the radio terminal in dual-band fashion for the GSM and DCS 1800 mobile radio systems together, three registers for holding different counter values are built into the PLL counter of the intermediate-frequency portion. In this way, three fundamental frequencies can be generated, which are sufficient for operating the radio terminal in accordance with both mobile radio standards.

For use in the dual mode, it is especially advantageous that further registers for holding different divider values are present in the RF-PLL, by way of which registers the reference frequency (channel frequency) of one mobile radio system can be set in the RF-PLL, and that switching elements by which the system-specific operating parameters can be switched over or set are triggerable via the input register.

In accordance with an added feature of the invention, the second phase-locked loop has a selection device with input terminals for selecting the further divider ratios from the memory of the second phase-locked loop, and the selection device is coupled to the memory of the first phase-locked loop.

In accordance with an additional feature of the invention, the memory of the first phase-locked loop has a register with bit positions, and a content of the bit positions of the register are received by the input terminals of the selection device.

In accordance with another feature of the invention, the first phase-locked loop has a further memory connected to the second frequency divider of the first phase-locked loop, and the further memory receives additional divider ratios for the second frequency divider of the first phase-locked loop.

In accordance with a further added feature of the invention, the first phase-locked loop has a further selection device with input terminals for selecting the additional divider ratio to be received by the second frequency divider of the first phase-locked loop, and the further selection device is coupled to the memory of the first phase-locked loop.

In accordance with a further additional feature of the invention, the memory of the first phase-locked loop has a register with bit positions, the input terminals of the further selection device receives the content of the bit positions of the register.

In accordance with yet another feature of the invention, the memory of the first phase-locked loop and the memory of the second phase-locked loop each have one shift register into which respective frequency divider data is serially written.

With the foregoing and other objects in view there is also provided, in accordance with the invention, a frequency synthesizer for a radio terminal, including: a clock outputting a clock signal; a phase-locked loop for generating a high-frequency signal, having: a first frequency divider receiving the high-frequency signal; a second frequency divider receiving the clock signal; a first memory connected to the first frequency divider and storing divider ratios; and a second memory connected to the second frequency divider and to the first memory, and the second memory storing further divider ratios.

In accordance with an added feature of the invention, the phase-locked loop has a selection device with input terminals for selecting the further divider ratios of the second memory to be received by the second frequency divider, and the selection device is coupled to the first memory.

In accordance with an additional feature of the invention, the first memory has a register with bit positions and the input terminals of the selection device receives the content of the bit positions of the register.

In accordance with a concomitant feature of the invention, the first memory and the second memory each have one shift register into which respective frequency divider data is serially written.

Other features which are considered as characteristic for the invention are set forth in the appended claims.

Although the invention is illustrated and described herein as embodied in a frequency synthesizer for a radio terminal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figures 1, 2:
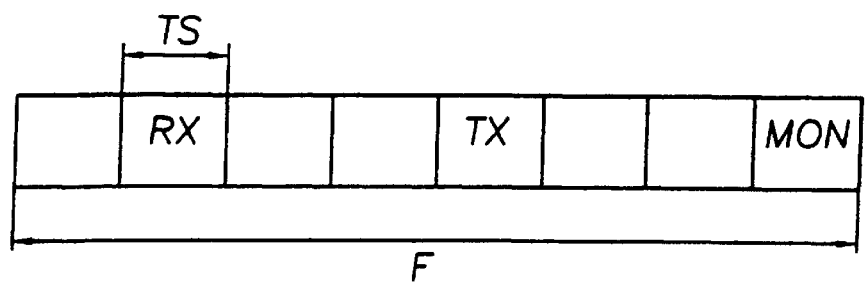
FIG. 1 is a diagrammatic view of a time frame for GSM and DCS 1800 standards.
FIG. 2 is a table showing frequencies to be generated in a dual-band radio terminal.

In all the figures of the drawing, sub-features and integral parts that correspond to one another bear the same reference symbol in each case. Referring now to the figures of the drawing in detail and first, particularly, to FIG. 1 thereof, there is shown a time frame F of GSM and DCS 1800 standards that include eight time slots TS. In the example shown, a second time slot RX is intended for a receiving mode of a radio terminal for receiving signals from a base station. A fifth time slot TX is reserved for transmission for a transmission mode, and an eighth time slot MON is used for monitoring operations. The frequencies used in the transmission and reception mode are different within one mobile radio system. Also, in the transmission mode the frequencies under the GSM standard and under the DCS 1800 standard are different.

Figure 3:
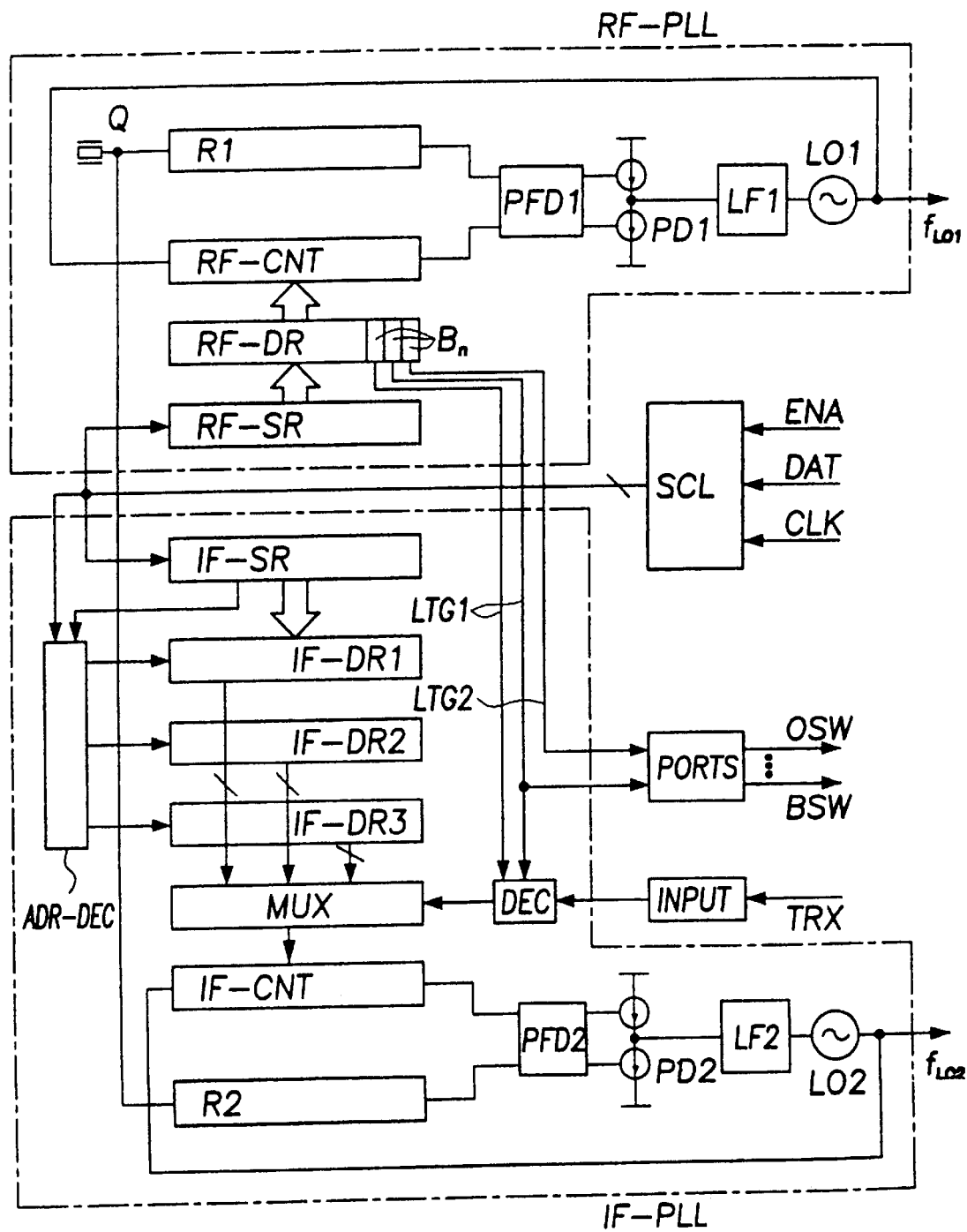
FIG. 3 is a block circuit diagram of a frequency synthesizer for the dual-band radio terminal.

As the table in FIG. 2 shows in conjunction with FIG. 3, in the present example, in a PLL array of an intermediate-frequency portion IF-PLL, three different frequencies have to be generated, which are each defined once and for all for the equipment architecture. The table also shows clearly that for applications for other mobile radio systems, which will not be addressed in detail here, in principle six different frequencies for the PLL array of a high-frequency portion RF-PLL and six further frequencies for the PLL array of the intermediate-frequency range IF-PLL may be necessary here.

The first column in FIG. 2 shows which mobile radio system and thus which band is involved. The second column lists the associated time slots RX, TX and MON. The third and fourth columns show system-dictated frequencies of the IF-PLL and RF-PLL assigned to the various time slots. The last column indicates an associated circuit portion of the radio terminal in which the frequencies contained in the associated line of the table are used.

In the example described here, the frequency IF-PLL of the RF-PLL is dependent on the time slots and the mobile radio systems and is different in each case. In the IF-PLL, the frequency $f_{LO2}$ (RX)1 is the same for the time slots RX and MON in both the GSM standard and the DCS 1800 standard. In the time slot TX of the GSM standard, a different frequency $f_{LO2}$ (TX)1 is used in the GSM standard, and a third frequency $f_{LO2}$ (TX)2 is used in the TX time slot of the DCS 1800 standard. The frequency synthesizer of the radio terminal must therefore generate three fixed intermediate frequencies, which upon the basic initialization are defined once and for all for the equipment architecture.

In FIG. 3, the functions of such a frequency synthesizer that suits the situations described in FIG. 2 will now be described. The clock pulse of a quartz clock Q is supplied to a PLL array of the high-frequency portion (RF-PLL) via a counter R1. An adjustable counter RF-CNT is located in the feedback branch of the RF-PLL, and its output is carried together with the output of the divider R1 to a phase detector PFD1.

The output signal PD1 of the phase detector PFD1 is delivered via a filter LF1 to a local voltage-controlled oscillator LO1, from whose output the frequency $f_{LO1}$ is fed back to the counter RF-CNT. In the same way, the output of the quartz clock Q is applied to a further divider R2 of the intermediate-frequency portion IF-PLL. In both dividers R1, R2, the quartz clock rate, for instance 130 MHz, is divided to a typical channel frequency $f_{ch}$ for the applicable mobile radio network, such as 200 kHz. The contents of the dividers R1, R2 remain unchanged throughout operation.

A further adjustable counter IF-CNT is located in the feedback branch of the intermediate-frequency portion IF-PLL and is connected together with the divider R2 to a further phase detector PFD2. The output signal PD2 of the further phase detector PFD2 is applied to a further filter LF2 and a further local voltage controlled oscillator LO2, whose frequency $f_{LO2}$ is fed back to the further counter IF-CNT.

To obtain simple adaptation of the frequency $f_{LO2}$ of the IF-PLL to the frequency $f_{LO1}$ of the RF-PLL when a switchover from one mobile radio system to another is made, a basic initialization must be performed, in which the requisite divider values for the IF-PLL are stored in memory. In later operation, the divider values are then used, as a function of the particular divider value that is written into the counter RF-CNT of the RF-PLL, to set the counter IF-CNT, without the user of the equipment having to take any action. In other words, on the basis of operating and control data that are generated by a non-illustrated base band process in the mobile unit, the frequency assignment shown in FIG. 2 is made automatically. The data each reach respective memory devices in the RF-PLL and the IF-PLL via a three-line bus ENA, DAT, CLK via a serial control unit SCL.

The memory devices, in the present example, for the RF-PLL, include an input-side shift register RF-SR, which is followed by a data register RF-DR that is used for transferring data to the counter RF-CNT. In the IF-PLL, the memory apparatus includes an input-side shift register IF-SR, which is followed by three data registers IF-DR1, IF-DR2, IF-DR3, which are triggerable via an address decoder ADR-DEC. Each of the data registers is selected via a multiplexer MUX, so that the register will transfer its contents to the counter IF-CNT. The multiplexer MUX may be triggered in two ways, alternatively or in combination, via one decoder DEC. First, an external signal TRX may be applied to the decoder DEC via an input circuit INPUT. However, preferably, it is triggered by the RF-PLL in such a way that predetermined register places $B_n$ of the data register RF-DR, which correspond to predetermined bit places in the register contents, are connected via lines LTG1 to the decoder DEC. In the example in FIG. 2, this involves two high-ranking bit places in the contents of the data register RF-DR. The most-significant register place in this example is intended for selecting an output interface PORTS, which serves together with a line LTG2 leading to the decoder DEC to select externally available control signals OSW, BSW.

The triggering of the decoder DEC is done via control bits, which are written into the data register RF-DR in addition to the divider value. The applicable registers RF-SR and RF-DR therefore have correspondingly more register places than the number of bits in the divider values.

In the basic initialization, via the serial control unit SCL, the required divider values for the IF-PLL are written successively into the shift register IF-SR. In the present example, in accordance with FIG. 2, column 3, this involves three divider values, which are stored in memory by the shift register IF-SR in the three data registers IF-DR in conjunction with the address decoder ADR-DEC. Each of the shift registers IF-DR thus contains one divider value for generating the frequencies $f_{LO2}$ (RX), $f_{LO2}$ (TX) (1), and $f_{LO2}$ (TX)2.

In operation, for each time slot RX, TX and MON, a new frequency $f_{LO1}$ is generated, as indicated in column 4 of FIG. 2. The divider values to be written into the counter RF-CNT are obtained as described above from the serial control unit SCL. Once the appropriate divider value has been written into the data register RF-DR by the shift register RF-SR, the register places necessary for triggering the decoder DEC are activated, and the switching through of the associated data register IF-DR to the counter IF-CNT is done automatically via the multiplexer MUX, so that the divider value required for the IF-PLL is written into the counter IF-CNT. The consequence of this is the desired change in the frequency $f_{LO2}$ of the IF-PLL. For decoder triggering, the external signal TRX can selectively be used as well.

In this way, a coupling is made between the RF-PLL and the IF-PLL, with which coupling, the currently appropriate divider value is written into the counter IF-CNT automatically, on the basis of the contents of the data register RF-DR.

The signals OSW, BSW selected via the output circuit PORTS, can be used to switched over other components, such as filters, oscillators, and the like of the applicable terminal to the parameters of the applicable mobile radio system. The switchover is likewise done automatically as a function of the contents of the corresponding register places in the data register RF-DR of the RF-PLL.

If the terminal in question operates first by the GSM standard, for instance, and is at the moment in the time slot RX, then via the serial control unit SCL, the shift register RF-SR and the data register RF-DR, a divider value is written in that causes the frequency $f_{LO1}$ (RX)1 to be generated. At the same time, by the corresponding bits in the data register RF-DR, the MUX is triggered via the decoder DEC in such a way that the divider value required to generate the frequency $f_{LO2}$ (RX) is written by the corresponding data register IF-DR into the counter IF-CNT. If a switchover is then made to the DCS 1800 standard, for instance, and to the time slot TX, then in the same way the required divider values are written into the counters RF-CNT and IF-CNT, in order to generate the frequencies $f_{LO1}$ (TX)2 and $f_{LO2}$ (TX)2.

Figure 4:
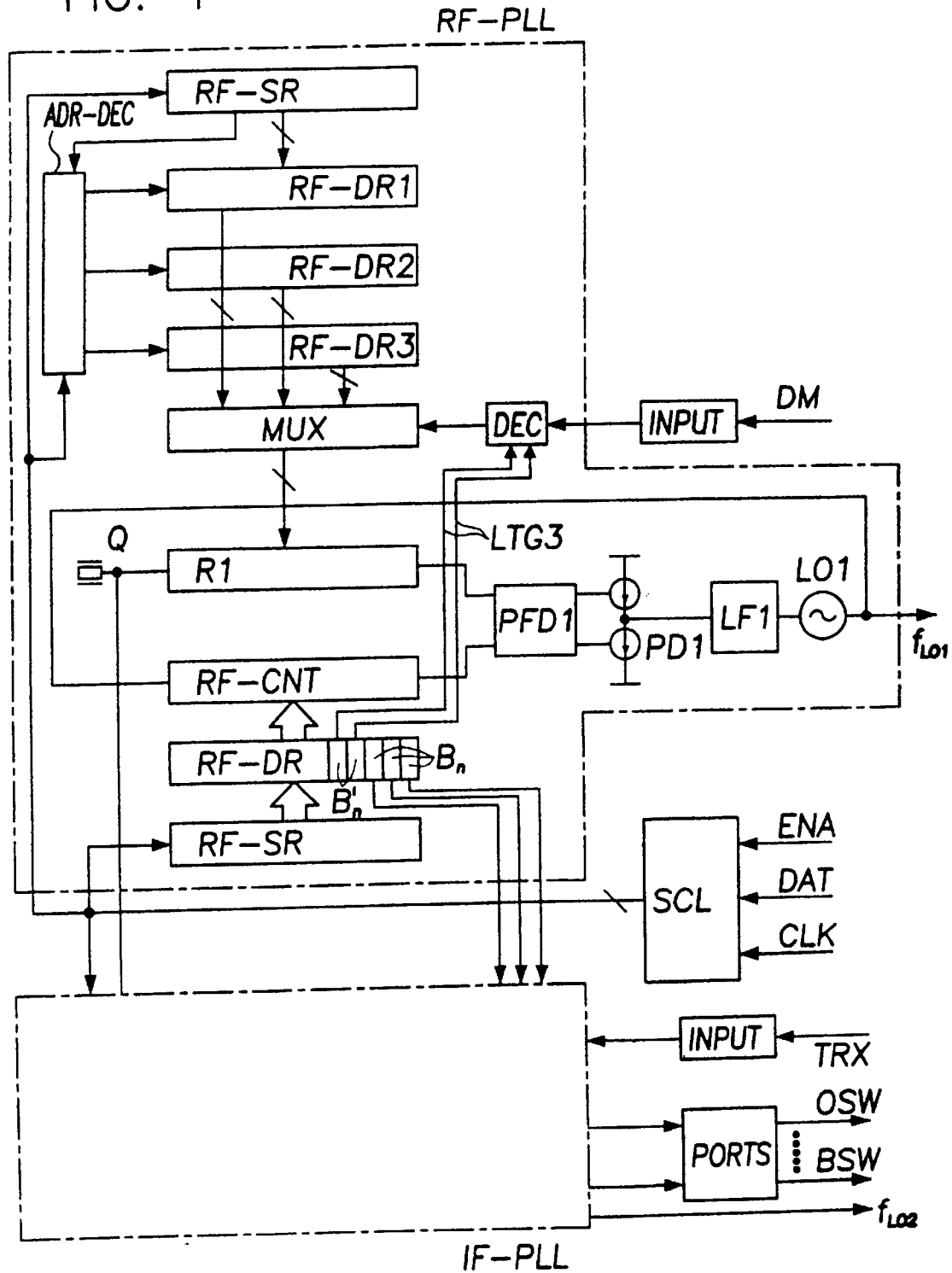
FIG. 4 is a block circuit diagram of the frequency synthesizer for the dual-mode radio terminal.

In the example of FIG. 4, in addition to the functions described for the example in FIG. 2, the contents of the divider R1 can also be varied by divider values stored in memory. The circuitry and function of the IF-PLL corresponds without changes to the example shown in FIG. 3. The switchover of the divider R1 in the RF-PLL is done logically like the switchover of the IF-PLL described in conjunction with FIG. 2. Accordingly, a memory is provided, which upon a basic initialization is occupied by the requisite divider values. In operation, one of the divider values at a time is selected and written into the divider R1. The selection is again made automatically, using predetermined register places $B'_n$ and/or via an external selection signal DM.

In the following example, the memory apparatus includes an input-side shift register RF-SR and three data registers RF-DR1-3 following it, which are selected via an address decoder ADR-DEC upon the basic initialization. In operation, then, one of the three data registers RF-DR1-3 is connected via a multiplexer MUX to the divider R1 so that the corresponding divider value will be written in. The multiplexer MUX is in turn triggered via a decoder DEC, which is acted upon on its input side with the corresponding register places $B'_n$ of the data register RF-DR and/or by an input circuit INPUT. In this way, typical channel frequencies for different mobile radio networks can be set. Although in the present case shown in FIG. 4, in which there are the three data registers RF-DR1, RF-DR2, RF-DR3, the need is to be able to generate three different channel frequencies, this must be understood merely as an example, which can be adapted as needed to generate further different channel frequencies by correspondingly modifying this memory apparatus.

We claim:

1. A frequency synthesizer for a radio terminal, comprising:

a clock outputting a clock signal;

a first phase-locked loop for generating a high-frequency signal, including:

a first frequency divider receiving the high-frequency signal;

a second frequency divider receiving the clock signal; and a memory connected to said first frequency divider and storing divider ratios;

a second phase-locked loop for generating an intermediate-frequency signal, including:

a first frequency divider receiving the intermediate frequency signal;

a second frequency divider receiving the clock signal; and memory connected to said first frequency divider and storing further divider ratios; and said memory of said first phase-locked loop coupled to said memory of said second phase-locked loop;

said second phase-locked loop having a selection device with input terminals for selecting the further divider ratios from said memory of said second phase-locked loop, and said selection device being coupled to said memory of said first phase-locked loop;

said memory of said first phase-locked loop having a register for storing the divider ratios having additional control bit positions, the control bits written in said control bit positions of said register being received by said input terminals of said selection device for selecting further divider ratios from said memory of said second phase-locked loop.

2. The frequency synthesizer according to claim 1, wherein said first phase-locked loop has a further memory connected to said second frequency divider of said first phase-locked loop, said further memory receiving additional divider ratios for said second frequency divider of said first phase-locked loop.

3. The frequency synthesizer according to claim 2, wherein said first phase-locked loop has a further selection device with input terminals for selecting the additional divider ratio to be received by said second frequency divider of said first phase-locked loop, and said further selection device is coupled to said memory of said first phase-locked loop.

4. The frequency synthesizer according to claim 3, wherein said memory of said first phase-locked loop has a register with bit positions, said input terminals of said further selection device receiving a content of said bit positions of said register.

5. The frequency synthesizer according to claim 1, wherein said memory of said first phase-locked loop and said memory of said second phase-locked loop each have one shift register into which respective frequency divider data is serially written.

6. A frequency synthesizer for a radio terminal, comprising:

a clock outputting a clock signal;

a phase-locked loop for generating a high-frequency signal, including:

a first frequency divider receiving the high-frequency signal;

a second frequency divider receiving the clock signal;

a first memory connected to said first frequency divider and storing divider ratios; and a second memory connected to said second frequency divider and to said first memory, and said second memory storing further divider ratios;

said phase-locked loop having a selection device with input terminals for selecting further divider ratios of said second memory to be received by said second frequency divider, said selection device being coupled to said first memory; and said first memory having a register for storing divider ratios having additional control bit positions, the control bits written in said control bit positions of said register being received by said input terminals of said selection device for selecting further divider ratios from said memory of said register.

7. The frequency synthesizer according to claim 6, wherein said first memory and said second memory each have one shift register into which respective frequency divider data is serially written.

* * * * *